(12) United States Patent
Matsuzaki et al.

(10) Patent No.: US 12,166,320 B2
(45) Date of Patent: Dec. 10, 2024

(54) STORAGE SYSTEM

(71) Applicant: Kioxia Corporation, Tokyo (JP)

(72) Inventors: Kazuyuki Matsuzaki, Yokohama Kanagawa (JP); Naoki Kimura, Ebina Kanagawa (JP)

(73) Assignee: Kioxia Corporation, Tokyo (JP)

( * ) Notice: Subject to any disclaimer, the term of this patent is extended or adjusted under 35 U.S.C. 154(b) by 636 days.

(21) Appl. No.: 17/472,382

(22) Filed: Sep. 10, 2021

(65) Prior Publication Data
US 2022/0302661 A1  Sep. 22, 2022

(30) Foreign Application Priority Data

Mar. 22, 2021 (JP) ................................ 2021-047259

(51) Int. Cl.
| | | |
|---|---|---|
| H01R 25/00 | (2006.01) | |
| H01R 12/70 | (2011.01) | |
| H01R 12/73 | (2011.01) | |
| H05K 1/14 | (2006.01) | |
| H05K 7/20 | (2006.01) | |

(52) U.S. Cl.
CPC ....... *H01R 25/006* (2013.01); *H01R 12/7076* (2013.01); *H01R 12/73* (2013.01); *H05K 1/144* (2013.01); *H05K 7/20509* (2013.01); *H05K 2201/10159* (2013.01); *H05K 2201/10545* (2013.01)

(58) Field of Classification Search
CPC .. H01R 25/006; H01R 12/7076; H01R 12/73; H05K 1/144
See application file for complete search history.

(56) References Cited

U.S. PATENT DOCUMENTS

| | | | | |
|---|---|---|---|---|
| 5,334,046 A | * | 8/1994 | Brouillette | H01R 12/722 439/541.5 |
| 5,472,351 A | * | 12/1995 | Greco | H05K 5/0273 439/924.1 |
| 5,793,998 A | * | 8/1998 | Copeland | G06F 13/4095 710/305 |
| 6,151,215 A | | 11/2000 | Hoffman | |

(Continued)

FOREIGN PATENT DOCUMENTS

| | | |
|---|---|---|
| JP | 2001-111262 A | 4/2001 |
| JP | 2017-182983 A | 10/2017 |
| TW | 202036553 A | 10/2020 |

*Primary Examiner* — Neil Abrams
(74) *Attorney, Agent, or Firm* — Maier & Maier, PLLC

(57) ABSTRACT

According to one embodiment, a storage system includes a circuit board, a connector, a first memory system, and a second memory system. The connector is on the circuit board and includes first and second slots, the first slot having a first terminal group of first terminals aligned in a first direction, and the second slot being separated from the first slot in a second direction not parallel with the first direction and having a second terminal group of second terminals aligned in the first direction. The first terminal group is reverse to the second terminal group in terminal arrangement order in the first direction. The first memory system is connectable to the first terminal group, while the first memory system is inserted into the first slot. The second memory system is connectable to the second terminal group, while the second memory system is inserted into the second slot.

20 Claims, 11 Drawing Sheets

(56) References Cited

U.S. PATENT DOCUMENTS

| | | | | |
|---|---|---|---|---|
| 8,449,322 B2* | 5/2013 | Cai | ............ | H01R 12/724 |
| | | | | 439/541.5 |
| 8,864,518 B2* | 10/2014 | Ming | ............ | G02B 6/42 |
| | | | | 439/541.5 |
| 9,004,938 B2* | 4/2015 | Chang | ............ | H01R 12/716 |
| | | | | 439/541.5 |
| 10,085,364 B2 | 9/2018 | Voss | | |
| 11,258,195 B2* | 2/2022 | Kimura | ............ | H05K 1/141 |
| 2012/0282803 A1* | 11/2012 | Augsburger | ............ | H01R 13/518 |
| | | | | 29/829 |
| 2016/0335220 A1 | 11/2016 | Breakstone et al. | | |
| 2020/0301617 A1 | 9/2020 | Kimura | | |
| 2020/0313323 A1 | 10/2020 | Qiao et al. | | |
| 2022/0302661 A1* | 9/2022 | Matsuzaki | ............ | H01R 12/73 |

* cited by examiner

STORAGE SYSTEM

CROSS-REFERENCE TO RELATED APPLICATION

This application is based upon and claims the benefit of priority from Japanese Patent Application No. 2021-047259, filed Mar. 22, 2021; the entire contents of which are incorporated herein by reference.

FIELD

Embodiments described herein relate generally to a storage system.

BACKGROUND

There is known a storage system including a circuit board, a connector mounted on the circuit board, and a memory module attached to the connector.

DETAILED DESCRIPTION

Figure 1:
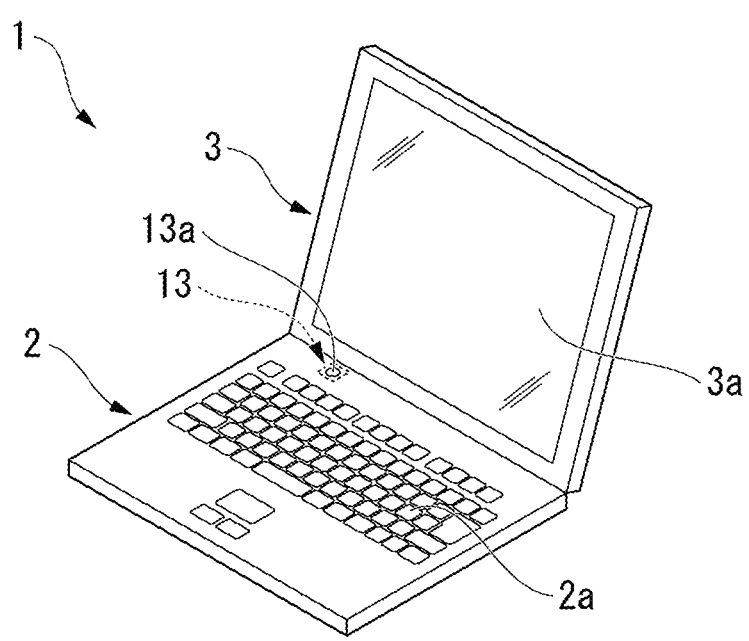
FIG. 1 is a perspective view showing an overall configuration of a storage system according to an embodiment.

According to some embodiment, a storage system includes a circuit board, a connector, a first memory system, and a second memory system. The connector is on the circuit board and includes a first slot and a second slot, the first slot having a first terminal group of first terminals aligned in a first direction, and the second slot being separated from the first slot in a second direction not parallel with the first direction and having a second terminal group of second terminals are arranged in the first direction. The first terminal group is reverse to the second terminal group in terminal arrangement order in the first direction. The first memory system is connectable to the first terminal group, while the first memory system is inserted into the first slot, and the first memory system comprising a first substrate and a first semiconductor memory device on the first substrate. The second memory system is connectable to the second terminal group, while the second memory system is inserted into the second slot, and the second memory system comprising a second substrate and a second semiconductor memory device on the second substrate.

Hereinafter, a storage system according to an embodiment will be described with reference to the drawings. In the following description, configurations having the same or similar functions are denoted by the same reference numerals. Then, the duplicate description of those configurations may be omitted. The term "parallel", "orthogonal", or "same" may also include cases of "substantially parallel", "substantially orthogonal", or "substantially the same", respectively. The term "connection" is not limited to mechanical connection, but may also include electrical connection. That is, the term "connection" is not limited to a case where it is directly connected to an object, but may also include a case where it is connected to the object with another element interposed therebetween.

Embodiment

1. Overall Configuration of Storage System

FIG. 1 is a perspective view showing an overall configuration of a storage system 1 according to an embodiment. The storage system 1 is, for example, an information processing device (or electronic device) such as a notebook personal computer. However, the storage system 1 is not limited to the above example, and various information processing devices such as a stationary personal computer, a server device, a mobile information terminal device, and an in-vehicle device are appropriately applicable.

The storage system 1 includes, for example, a main body unit 2 and a display unit 3 that can be opened and closed with respect to the main body unit 2. The main body unit 2 has an input device 2a such as a keyboard. The display unit 3 has a display device 3a capable of displaying an image or video.

In the present embodiment, the main body unit 2 has a notification device 13. When a solid state drive (SSD) module 30 to be described below is in operation, the notification device 13 notifies an outside (for example, a user) that the SSD module 30 is in operation. The notification device 13 includes, for example, a light emitting diode (LED) 13a that can be visually recognized from the outside of the main body unit 2, and a control circuit that controls light emission of the LED 13a. The notification device 13 provides notification that the SSD module 30 is in operation by blinking the LED 13a, for example.

Figure 2:
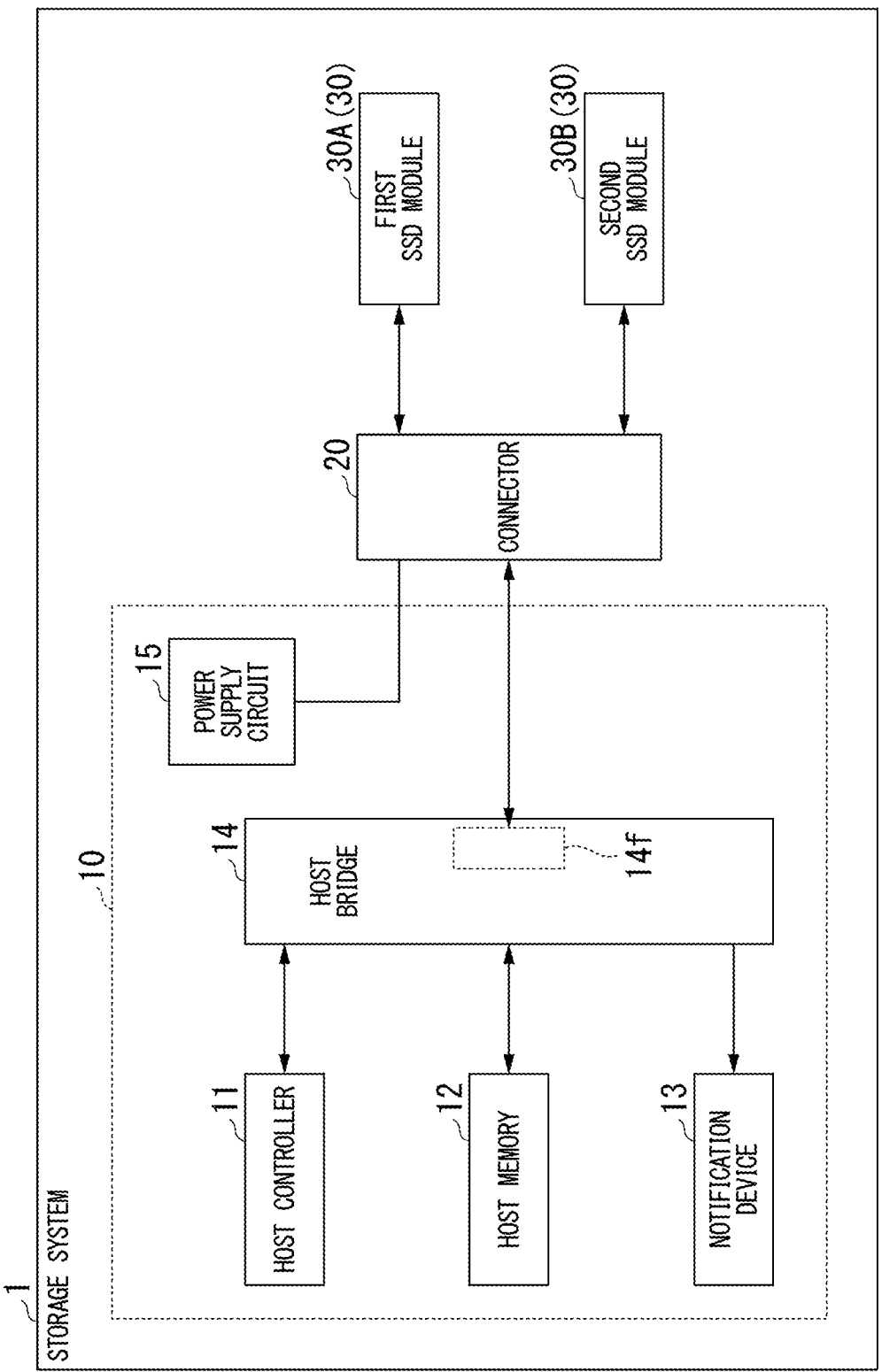
FIG. 2 is a block diagram showing part of a functional configuration of the storage system according to the embodiment.

FIG. 2 is a block diagram showing part of a functional configuration of the storage system 1. The storage system 1 includes, for example, a host controller 11, a host memory 12, the notification device 13, a host bridge 14, a power supply circuit 15, a connector 20, and a plurality of the SSD modules 30. The plurality of SSD modules 30 include a first SSD module 30A and a second SSD module 30B. In the present embodiment, an example of a host device 10 including the host controller 11, the host memory 12, the notification device 13, the host bridge 14, and the power supply circuit 15 is configured. The connector 20 may be provided as part of the host device 10.

The host controller 11 is realized by executing a program (software) by a hardware processor such as a central processing unit (CPU) included in the storage system 1. Note that all or some of functions of the host controller 11 may be realized by hardware (including circuit section; circuitry), such as an application specific integrated circuit (ASIC), a programmable logic device (PLD), or a field programmable gate array (FPGA), or may be realized by cooperation of software and hardware.

The host controller 11 controls the storage system 1. For example, the host controller 11 performs writing, reading, or erasing of data with respect to the SSD module 30. In the present embodiment, the host controller 11 transmits and receives data to and from the SSD module 30 via the host bridge 14 and the connector 20.

The host memory 12 is composed of a dynamic random access memory (DRAM) or the like provided in the storage system 1. The host memory 12 is, for example, a data buffer for temporarily storing data transferred between the host controller 11 and the SSD module 30. The host memory 12 is connected to the host controller 11 via the host bridge 14. Note that the host memory 12 may be directly connected to the host controller 11.

The host bridge 14 is provided between the host controller 11 and the host memory 12, and the connector 20. The host bridge 14 includes a host interface circuit (host I/F) 14f. The host I/F 14f is connected to the SSD module 30 via a wire and the connector 20 provided on a circuit board (e.g. a substrate) 16 to be described below. The host I/F 14f performs transmission and reception of data, commands, and addresses between the host controller 11 and the SSD module 30. The host I/F 14f conforms to communication interface standards such as PCI Express (PCIe) (registered trademark), NVM Express (NVMe) (registered trademark), serial advanced technology attachment (SATA), or serial attached SCSI (SAS), for example. The host bridge 14 is an example of a "bridge circuit".

The power supply circuit 15 is provided on the circuit board 16 to be described below and is connected to the connector 20. The power supply circuit 15 supplies power to the SSD module 30 via the connector 20.

The connector 20 is provided between the host bridge 14 and the power supply circuit 15 and the SSD module 30. The SSD module 30 is detachably attached to the connector 20 which connects the host bridge 14 and the SSD module 30 to each other and also connects the power supply circuit 15 and the SSD module 30 to each other. Details of the connector 20 will be described below.

Each of the first SSD module 30A and the second SSD module 30B is a storage device that non-volatilely stores the data received from the host device 10. The first SSD module 30A is an example of a "first memory system". The second SSD module 30B is an example of a "second memory system". In the present embodiment, in a case where the first SSD module 30A and the second SSD module 30B are not distinguished, they are referred to as an "SSD module 30".

2. Configuration of SSD Module

Next, a configuration of the SSD module 30 will be described.

Figure 3:
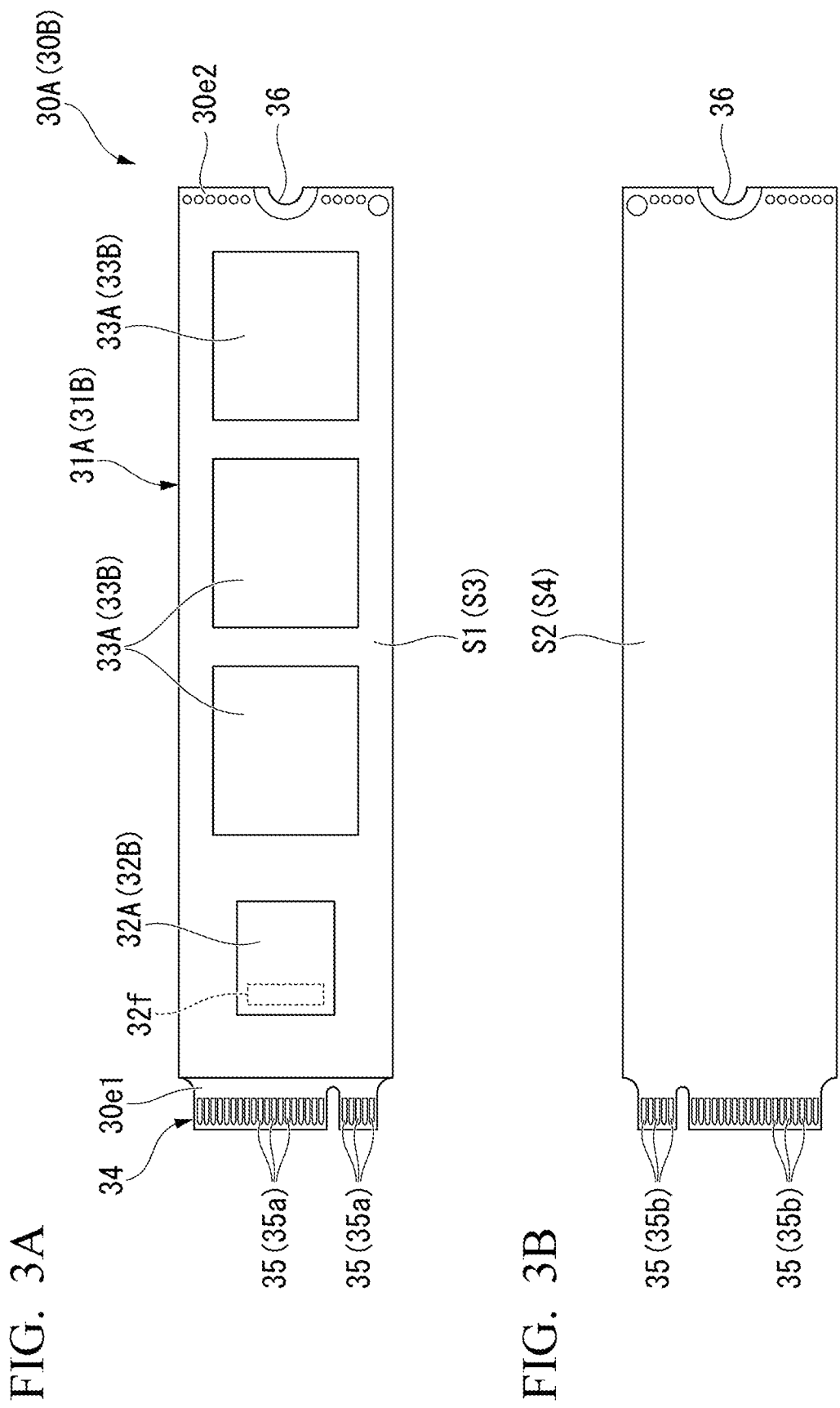
FIGS. 3A and 3B are diagrams showing an SSD module according to the embodiment.

FIGS. 3A and 3B are diagrams showing the SSD module 30 (for example, the first SSD module 30A). FIG. 3A is a surface view of the SSD module 30 (for example, the first SSD module 30A). FIG. 3B is a back view of the SSD module 30 (for example, the first SSD module 30A). That is, FIG. 3B is a diagram showing the SSD module 30 shown in FIG. 3A in a reversed state. The first SSD module 30A includes a first substrate (e.g. a circuit board) 31A, a first memory controller 32A, and one or more (for example, a plurality of) first semiconductor memory devices 33A.

The first substrate 31A is a circuit board or a printed wiring board having an insulator such as a glass epoxy resin and a wiring pattern provided on a surface layer and an inner layer of the insulator. The first substrate 31A has a first surface S1 and a second surface S2 located on a side opposite to the first surface S1. In the present embodiment, the first memory controller 32A and the plurality of first semiconductor memory devices 33A are mounted on the first surface S1. On the other hand, no memory controller and no semiconductor memory device are mounted on the second surface S2.

The first substrate 31A has a first end portion 30e1 attached to the connector 20 and a second end portion 30e2 located on a side opposite to the first end portion 30e1. The first end portion 30e1 has a terminal portion 34 including a plurality of terminals 35. The plurality of terminals 35 are provided on the surface (that is, the first surface S1 and the second surface S2) of the first substrate 31A and are exposed on the surface of the first substrate 31A. The plurality of terminals 35 include a plurality of terminals 35a provided on the first surface S1 of the first substrate 31A and a plurality of terminals 35b provided on the second surface S2 of the first substrate 31A. Each of the plurality of terminals 35 has an elongated flat plate shape. The terminal portion 34 conforms to the same communication interface standard as the host I/F 14f. The terminal portion 34 conforms to, for example, the M.2 standard. The second end portion 30e2 is provided with a recess portion 36 whose position is fixed by a fixing member 153 (see FIG. 4) to be described below.

The first memory controller 32A is provided between the first end portion 30e1 of the first substrate 31A and the plurality of first semiconductor memory devices 33A. The first memory controller 32A has an interface circuit (host connection I/F) 32f for host connection. The host connection I/F 32f is connected to the host I/F 14f (see FIG. 2) of the host bridge 14 via the terminal portion 34 and the connector 20 of the first substrate 31A. The host connection I/F 32f conforms to the same communication interface standard as the host I/F 14f of the host bridge 14.

The first memory controller 32A is connected to the plurality of first semiconductor memory devices 33A through a wire provided on the first substrate 31A. The first memory controller 32A controls the plurality of first semiconductor memory devices 33A. For example, the first memory controller 32A performs writing, reading, and erasing of data with respect to the plurality of first semiconductor memory devices 33A based on instructions received from the host device 10.

The first semiconductor memory device 33A is a non-volatile semiconductor memory device that non-volatilely stores data and is, for example, a NAND flash memory. However, the first semiconductor memory device 33A is not limited to the above example and may be a magnetoresistive random access memory (MRAM) or other type of storage device.

The first SSD module 30A may have a volatile memory 37A (see FIG. 11) mounted on the first substrate 31A in addition to the above-described configuration. The volatile memory 37A is composed of a DRAM or the like. The volatile memory 37A includes a data buffer for temporarily storing data transferred between the host device 10 and the first semiconductor memory device 33A.

Similarly, the second SSD module 30B includes a second substrate (e.g. a circuit board) 31B, a second memory controller 32B, and one or more (for example, a plurality of) second semiconductor memory devices 33B. In the present embodiment, the second SSD module 30B is a memory module of the same type as the first SSD module 30A. Therefore, in description regarding the second SSD module 30B, the term "first SSD module 30A", "first substrate 31A", "first surface S1", "second surface S2", "first memory controller 32A", "first semiconductor memory device 33A", and "volatile memory 37A" in the above description regarding the first SSD module 30A need only be replaced with the term "second SSD module 30B", "second substrate 31B", "third surface S3", "fourth surface S4", "second memory controller 32B", "second semiconductor memory device 33B", and "volatile memory 37B", respectively.

In the present embodiment, the first SSD module 30A and the second SSD module 30B are completely the same type of memory module including device arrangement. However, the term "the same type of memory module" is not limited to a memory module of the same type completely and need only be a memory module conforming to the same standard. For example, the first SSD module 30A and the second SSD module 30B may have different numbers and capacities of mounted semiconductor memory devices.

3. Configuration Related to Connector

<3.1 Overall Configuration Around Connector>

Figure 4:
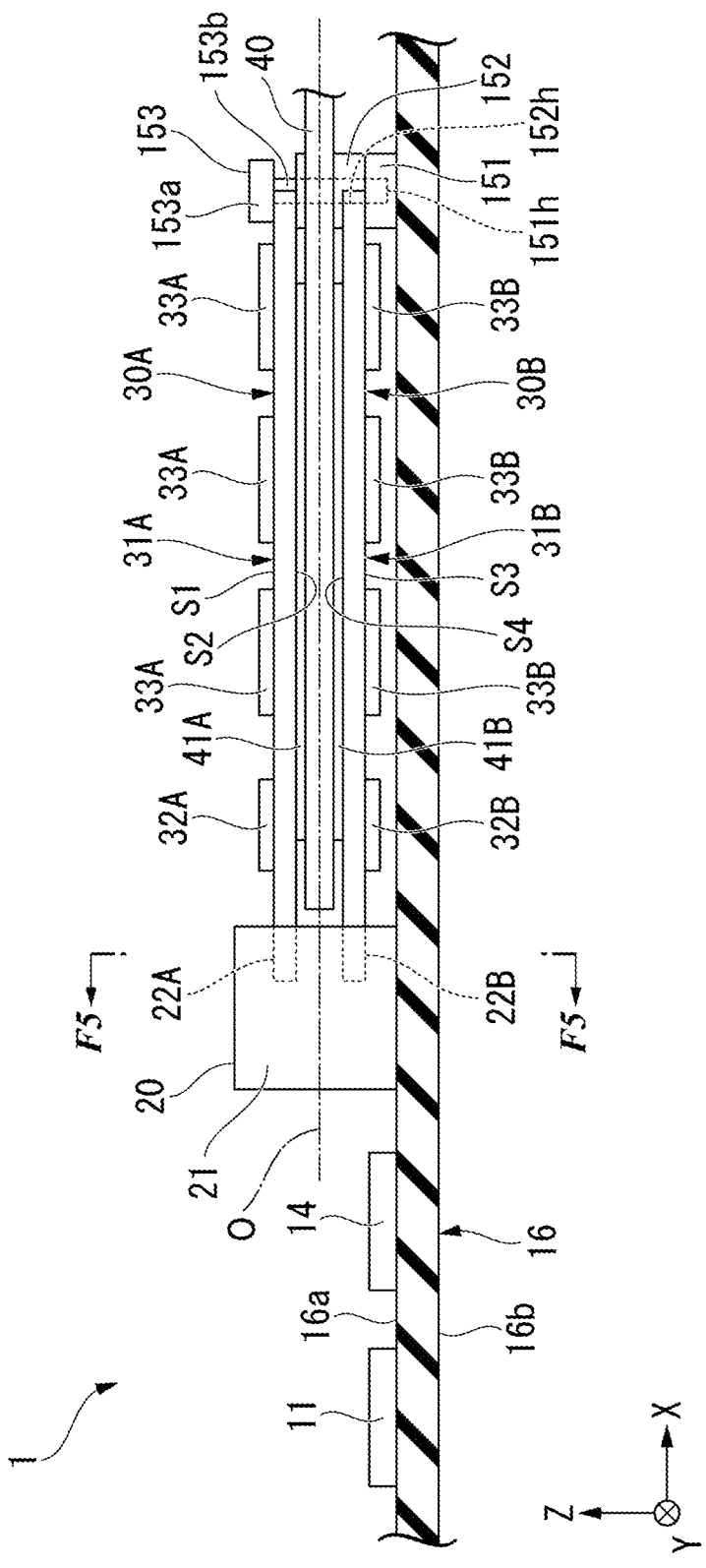
FIG. 4 is a cross-sectional view showing the storage system according to the embodiment.

FIG. 4 is a cross-sectional view showing the storage system 1. Here, an X direction, a Y direction, and a Z direction are defined. The X direction and the Y direction are directions along a first surface 16a of the circuit board 16 to be described below. The X direction is a direction from the connector 20 toward the SSD module 30. The Y direction is a direction not parallel with the X direction (for example, a direction orthogonal to the X direction) and is a width direction of the SSD module 30. The Z direction is a direction from the circuit board 16 toward the connector 20 and is a thickness direction of the circuit board 16. The Y direction is an example of a "first direction". The Z direction is an example of a "second direction". In the following, it may be referred to as "up" or "down" based on the posture of FIG. 4. However, these expressions do not specify a direction of gravity.

As shown in FIG. 4, in addition to the above-described host controller 11, host bridge 14, connector 20, first SSD module 30A, and second SSD module 30B, the storage system 1 includes the circuit board 16, a heat radiation member 40, a first heat conduction member 41A, and a second heat conduction member 41B.

<3.2 Configuration of Circuit Board>

The circuit board 16 is, for example, a motherboard of the storage system 1. The circuit board 16 has an insulator such as a glass epoxy resin and a wiring pattern provided on an inner layer and an outer layer of the insulator. The wiring pattern includes a plurality of wires extending between the host bridge 14 and the connector 20 and also includes a plurality of wires extending between the power supply circuit 15 and the connector 20. The circuit board 16 has the first surface 16a and a second surface 16b located on a side opposite to the first surface 16a. For example, the host controller 11, the host bridge 14, and the connector 20 are mounted on the first surface 16a of the circuit board 16. The first surface 16a is an example of a "mounting surface".

<3.3 Configuration of Connector>

Next, the connector 20 will be described. The connector 20 is a multi-stage connector. The connector 20 has, for example, a connector case 21, a first slot 22A, and a second slot 22B. The connector case 21 is made of an insulating resin member or the like. The connector case 21 forms an outer shell of the connector 20 and supports a plurality of terminals 51, 52, 53, and 54 included in four terminal groups TG1, TG2, TG3, and TG4 to be described below with reference to FIG. 5. The connector case 21 has a rectangular parallelepiped shape along the Y direction.

The first slot 22A and the second slot 22B are insertion parts provided in the connector case 21. Each of the first slot 22A and the second slot 22B is open in the X direction and extends in the Y direction. Each of the first slot 22A and the second slot 22B is, for example, a slot conforming to the M.2 standard. The first slot 22A and the second slot 22B are provided at different heights in the Z direction and are separated from each other in the Z direction. In the present embodiment, the second slot 22B is located between the first slot 22A and the circuit board 16 in the Z direction. The first SSD module 30A is detachably inserted into the first slot 22A. The second SSD module 30B is detachably inserted into the second slot 22B.

Figure 5:
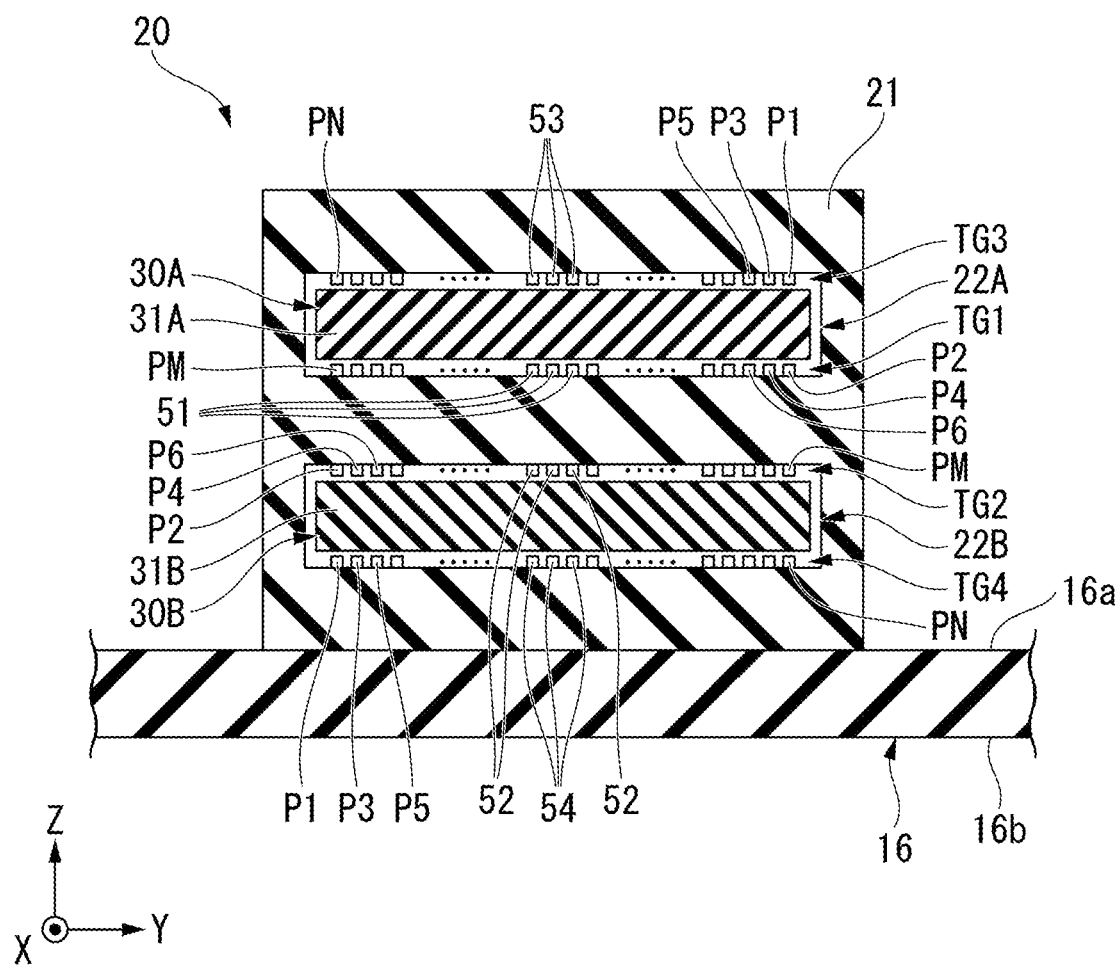
FIG. 5 is a cross-sectional view taken along line F5-F5 of a connector shown in FIG. 4.

FIG. 5 is a cross-sectional view taken along line F5-F5 of the connector 20 shown in FIG. 4.

The first slot 22A has a first terminal group TG1 and a third terminal group TG3. The first terminal group TG1 is located below (on the second surface S2 side of) the first substrate 31A of the first SSD module 30A inserted into the first slot 22A. In other words, the first terminal group TG1 is located between the third terminal group TG3 and the second slot 22B in the Z direction. The first terminal group TG1 has a plurality of terminals 51 aligned in the Y direction. The plurality of terminals 51 are in contact with the terminal portion 34 of the first substrate 31A of the first SSD module 30A from below (second surface S2 side) and are connected to the plurality of terminals 35b included in the terminal portion 34.

The third terminal group TG3 is located above (on the first surface S1 side of) the first substrate 31A of the first SSD module 30A inserted into the first slot 22A. In other words, the first substrate 31A of the first SSD module 30A is inserted between the first terminal group TG1 and the third terminal group TG3. The third terminal group TG3 has a plurality of terminals 53 aligned in the Y direction. The plurality of terminals 53 are in contact with the terminal portion 34 of the first substrate 31A of the first SSD module 30A from above (first surface S1 side) and are connected to the plurality of terminals 35a included in the terminal portion 34.

On the other hand, the second slot 22B has a second terminal group TG2 and a fourth terminal group TG4. The second terminal group TG2 is located below (on the fourth surface S4 side of) the second substrate 31B of the second SSD module 30B inserted into the second slot 22B. In other words, the second terminal group TG2 is located between the fourth terminal group TG4 and the first slot 22A in the Z direction. The second terminal group TG2 has a plurality of terminals 52 aligned in the Y direction. The plurality of terminals 52 are in contact with the terminal portion 34 of the second substrate 31B of the second SSD module 30B from below (fourth surface S4 side) and are connected to the plurality of terminals 35b included in the terminal portion 34. This content will be described in detail below.

The fourth terminal group TG4 is located above (on the third surface S3 side of) the second substrate 31B of the second SSD module 30B inserted into the second slot 22B. In other words, the second substrate 31B of the second SSD module 30B is inserted between the second terminal group TG2 and the fourth terminal group TG4. The fourth terminal group TG4 has a plurality of terminals 54 aligned in the Y direction. The plurality of terminals 54 are in contact with the terminal portion 34 of the second substrate 31B of the second SSD module 30B from above (third surface S3 side)

and are connected to the plurality of terminals 35a included in the terminal portion 34. This content will be described in detail below.

In the present embodiment, the second slot 22B has terminal arrangement (or signal arrangement) that is inverted (rotated) so as to be upside down with respect to the first slot 22A. The term "terminal arrangement" means arrangement (that is, an arrangement order) of a plurality of functions (power supply, ground, and various signals) assigned to a plurality of terminals. Then, the same signal is assigned to the first terminal group TG1 and the second terminal group TG2. Further, the same signal is assigned to the third terminal group TG3 and the fourth terminal group TG4.

More specifically, the order of the terminal arrangement of the first terminal group TG1 in the Y direction is reverse to the order of the terminal arrangement of the second terminal group TG2 in the Y direction. In the example shown in FIG. 5, terminal numbers (pin numbers) of P2, P4, P6, . . . , PM (M is any even number) are assigned to the plurality of terminals 51 of the first terminal group TG1 from the right side in FIG. 5. On the other hand, terminal numbers (pin numbers) of P2, P4, P6, . . . , PM are assigned to the plurality of terminals 52 of the second terminal group TG2 from the left side in FIG. 5. In the first terminal group TG1 and the second terminal group TG2, the same function (for example, the same signal) is assigned to the terminals having the same terminal number (same pin number).

Similarly, the order of the terminal arrangement of the third terminal group TG3 in the Y direction is reverse to the order of the terminal arrangement of the fourth terminal group TG4 in the Y direction. For example, in the example shown in FIG. 5, terminal numbers (pin numbers) of P1, P3, P5, . . . , PN (N is any odd number) are assigned to the plurality of terminals 53 of the third terminal group TG3 from the right side in FIG. 5. On the other hand, terminal numbers (pin numbers) of P1, P3, P5, . . . , PN are assigned to the plurality of terminals 54 of the fourth terminal group TG4 from the left side in FIG. 5. In the third terminal group TG3 and the fourth terminal group TG4, the same function (for example, the same signal) is assigned to the terminals having the same terminal number (same pin number).

Figure 6:
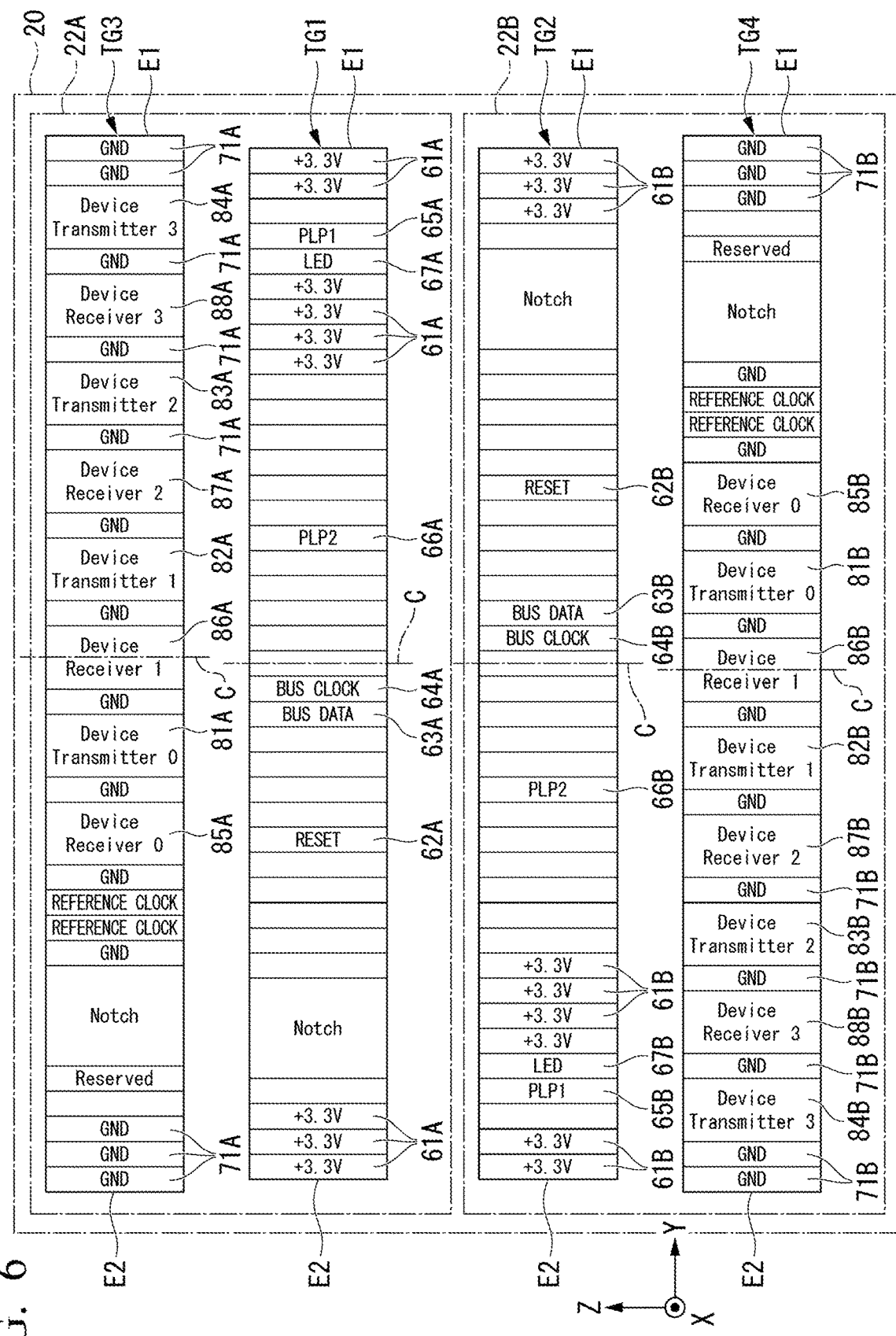
FIG. 6 is a diagram showing terminal arrangements of four terminal portions according to the embodiment.

FIG. 6 is a diagram showing terminal arrangements of the four terminal groups TG1, TG2, TG3, and TG4. Here, the first terminal group TG1 has a first end portion E1 and a second end portion E2 located on a side opposite to the first end portion E1 in the Y direction. The term "end portion" means, for example, a region in the first terminal group TG1 in which one (or two) terminals 51 exists from an end in the Y direction. This definition is the same for the second, third, and fourth terminal groups TG2, TG3, and TG4.

[First Terminal Group]

The plurality of terminals 51 of the first terminal group TG1 include, for example, a power supply terminal 61A, a reset signal terminal 62A, bus signal terminals 63A and 64A, power loss protection (PLP) signal terminals 65A and 66A, and a state signal terminal 67A. Each of the power supply terminal 61A, the reset signal terminal 62A, the bus signal terminals 63A and 64A, the PLP signal terminals 65A and 66A, and the state signal terminal 67A is an example of a "first terminal".

The power supply terminal 61A is a terminal through which power is supplied to the first SSD module 30A. A plurality of the power supply terminals 61A are provided at the first end portion E1 and the second end portion E2 of the first terminal group TG1. In the present embodiment, two terminals 51 from an end of the first end portion E1 of the first terminal group TG1 are power supply terminals 61A. Further, three terminals 51 from an end of the second end portion E2 of the first terminal group TG1 are power supply terminals 61A.

The reset signal terminal 62A is a terminal configured to allow a reset signal to be output for resetting the first SSD module 30A. The reset signal is, for example, a pre-reset signal transmitted from the host controller 11 when the host controller 11 first recognizes the first SSD module 30A. In the present embodiment, a reset signal for the first SSD module 30A and a reset signal for the second SSD module 30B are the same. The reset signal terminal 62A is located between the second end portion E2 of the first terminal group TG1 and a central portion C of the first terminal group TG1 in the Y direction. Then, the reset signal terminal 62A is located closer to the central portion C of the first terminal group TG1 than to the second end portion E2 of the first terminal group TG1 in the Y direction.

The bus signal terminals 63A and 64A include a bus data terminal 63A and a bus clock terminal 64A. The bus data terminal 63A is a terminal configured to allow a signal including address information to pass through, and the address information specifies one of the first SSD module 30A and the second SSD module 30B. The term "address information" referred to here may be address information indicating a signal transmission destination or address information indicating a signal transmission source. For example, a specific command with address information of a transmission destination destined for the first SSD module 30A or the second SSD module 30B flows to the bus data terminal 63A. The specific command is a command different from the request for writing, reading, or erasing of data with respect to the SSD module 30 and is, for example, a command for requesting temperature information of the SSD module 30. In addition, as a response to the specific command, a data signal (for example, a signal indicating a temperature information of the SSD module 30) with address information of the SSD module 30 of the transmission source passes through the bus data terminal 63A. The bus clock terminal 64A is a terminal configured to allow a clock signal used for reading the data signal passing through the bus data terminal 63A to pass through. The bus signal terminals 63A and 64A are terminals used as a system management bus (SM bus) in a PCIe standard, for example. The bus signal terminals 63A and 64A are located between the second end portion E2 of the first terminal group TG1 and the central portion C of the first terminal group TG1 in the Y direction. Then, the bus signal terminals 63A and 64A are located closer to the central portion C of the first terminal group TG1 than to the second end portion E2 of the first terminal group TG1 in the Y direction.

The PLP signal terminals 65A and 66A include a first PLP signal terminal 65A and a second PLP signal terminal 66A.

The first PLP signal terminal 65A is a terminal configured to allow a particular signal (hereinafter, referred to as a "first PLP signal") to be output from the host controller 11 to the first SSD module 30A when power supply to the first SSD module 30A is cut off. For example, when the power supply to the first SSD module 30A is cut off, the host controller 11 changes, as the first PLP signal, a voltage maintained at a first voltage (for example, a high level voltage) to a second voltage (for example, a low level voltage) having a voltage level different from that of the first voltage. When detecting the first PLP signal, the first SSD module 30A performs, for example, data saving processing for writing data temporarily stored in the volatile memory 37A to the first semiconductor memory device 33A.

The second PLP signal terminal 66A is a terminal for inputting a particular signal (hereinafter, a "second PLP signal") from the first SSD module 30A to the host controller 11 when the data saving processing of the first SSD module 30A is completed without failure. For example, when starting the data saving processing, the first SSD module 30A changes a voltage maintained at the first voltage (for example, a high level voltage) to the second voltage (for example, a low level voltage) having a voltage level different from that of the first voltage. Then, when the data saving processing is completed without failure, the first SSD module 30A returns the voltage maintained at the second voltage to the first voltage as the second PLP signal. As a result, the host controller 11 detects that the data saving processing has been completed without failure. When the host controller 11 detects that the data saving processing has been completed without failure, the host controller 11 cuts off the power supply to the first SSD module 30A.

The first PLP signal terminal 65A and the second PLP signal terminal 66A are located between the first end portion E1 of the first terminal group TG1 and the central portion C of the first terminal group TG1 in the Y direction. The first PLP signal terminal 65A is located closer to the first end portion E1 of the first terminal group TG1 than to the central portion C of the first terminal group TG1 in the Y direction. The second PLP signal terminal 66A is located closer to the central portion C of the first terminal group TG1 than to the first end portion E1 of the first terminal group TG1 in the Y direction.

The state signal terminal 67A is a terminal to which a state signal indicating that the first SSD module 30A is in operation is input from the first SSD module 30A when the first SSD module 30A is in operation (for example, in the operation of writing, reading, or erasing of data). For example, the state signal is maintained at the first voltage (for example, the high level voltage) by the first SSD module 30A when the first SSD module 30A is in operation. On the other hand, the state signal is maintained at the second voltage (for example, the low level voltage) having a voltage level different from that of the first voltage by the first SSD module 30A when the operation of the first SSD module 30A is stopped. When the voltage level of the state signal terminal 67A is maintained at the first voltage, the host controller 11 notifies the outside that the SSD module 30 is in operation by blinking the LED 13a of the notification device 13 of the main body unit 2.

[Second Terminal Group]

The second terminal group TG2 includes, for example, a power supply terminal 61B, a reset signal terminal 62B, bus signal terminals 63B and 64B, PLP signal terminals 65B and 66B, and a state signal terminal 67B, similarly to the first terminal group TG1. Each of the power supply terminal 61B, the reset signal terminal 62B, the bus signal terminals 63B and 64B, the PLP signal terminals 65B and 66B, and the state signal terminal 67B is an example of a "second terminal".

The power supply terminal 61B is a terminal through which power is supplied to the second SSD module 30B. A plurality of the power supply terminals 61B are provided at a first end portion E1 and a second end portion E2 of the second terminal group TG2. In the present embodiment, three terminals 52 from an end of the first end portion E1 of the second terminal group TG2 are power supply terminals 61B. Further, two terminals 52 from an end of the second end portion E2 of the second terminal group TG2 are power supply terminals 61B.

The reset signal terminal 62B is a terminal configured to allow a reset signal to be output for resetting the second SSD module 30B. The reset signal is, for example, a pre-reset signal transmitted from the host controller 11 when the host controller 11 first recognizes the second SSD module 30B. The reset signal terminal 62B is located between the first end portion E1 of the second terminal group TG2 and a central portion C of the second terminal group TG2 in the Y direction. Then, the reset signal terminal 62B is located closer to the central portion C of the second terminal group TG2 than to the first end portion E1 of the second terminal group TG2 in the Y direction.

The bus signal terminals 63B and 64B include a bus data terminal 63B and a bus clock terminal 64B. The bus data terminal 63B is a terminal configured to allow a signal including address information to pass through, and the address information specifies one of the first SSD module 30A and the second SSD module 30B. For example, a specific command with address information of a transmission destination destined for the first SSD module 30A or the second SSD module 30B flows to the bus data terminal 63B. In addition, as a response to the specific command, a data signal with address information of a SSD module 30 of the transmission source passes through the bus data terminal 63B. The bus clock terminal 64B is a terminal configured to allow a clock signal used for reading the data signal passing through the bus data terminal 63B to pass through. The bus signal terminals 63B and 64B are terminals used as an SM bus in a PCIe standard, for example. The bus signal terminals 63B and 64B are located between the first end portion E1 of the second terminal group TG2 and a central portion C of the second terminal group TG2 in the Y direction. Then, the bus signal terminals 63B and 64B are located closer to the central portion C of the second terminal group TG2 than to the first end portion E1 of the second terminal group TG2 in the Y direction.

The PLP signal terminals 65B and 66B include a first PLP signal terminal 65B and a second PLP signal terminal 66B.

The first PLP signal terminal 65B is a terminal configured to allow a first PLP signal to be output from the host controller 11 to the second SSD module 30B when power supply to the second SSD module 30B is cut off. The first PLP signal for the second SSD module 30B and the first PLP signal for the first SSD module 30A are the same signal. When detecting the first PLP signal, the second SSD module 30B performs, for example, data saving processing for writing data temporarily stored in the volatile memory 37B to the second semiconductor memory device 33B. In the present embodiment, when the power supply to the first SSD module 30A and the second SSD module 30B is cut off, the host controller 11 causes both the first PLP signal terminal 65A of the first terminal group TG1 and the first PLP signal terminal 65B of the second terminal group TG2 to output the first PLP signal.

The second PLP signal terminal 66B is a terminal for inputting a second PLP signal from the second SSD module 30B to the host controller 11 when the data saving processing of the second SSD module 30B is completed without failure. The second PLP signal output from the second SSD module 30B to the host controller 11 and the second PLP signal output from the first SSD module 30A to the host controller 11 are the same signal. When the host controller 11 detects that the data saving processing of the second SSD module 30B has been completed without failure, the host controller 11 cuts off the power supply to the second SSD module 30B. In the present embodiment, when voltage states of the second PLP signal terminal 66A of the first terminal group TG1 and the second PLP signal terminal 66B of the second terminal group TG2 return from the second voltage to the first voltage, the host controller 11 considers that the data saving processing of the first SSD module 30A and the second SSD module 30B has been completed without failure and cuts off the power supply to the first SSD module 30A and the second SSD module 30B.

The first PLP signal terminal 65B and the second PLP signal terminal 66B are located between the second end portion E2 of the second terminal group TG2 and the central portion C of the second terminal group TG2 in the Y direction. The first PLP signal terminal 65B is located closer to the second end portion E2 of the second terminal group TG2 than to the central portion C of the second terminal group TG2 in the Y direction. The second PLP signal terminal 66B is located closer to the central portion C of the second terminal group TG2 than to the second end portion E2 of the second terminal group TG2 in the Y direction.

The state signal terminal 67B is a terminal to which a state signal indicating that the second SSD module 30B is in operation is input from the second SSD module 30B when the second SSD module 30B is in operation (for example, in the operation of writing, reading, or erasing of data). For example, the state signal is maintained at the first voltage (for example, a high level voltage) by the second SSD module 30B when the second SSD module 30B is in operation and is maintained at the second voltage (for example, a low level voltage) having a voltage level different from that of the first voltage by the second SSD module 30B when the operation of the second SSD module 30B is stopped. When the voltage level of the state signal terminal 67B is maintained at the first voltage, the host controller 11 notifies the outside that the SSD module 30 is in operation by blinking the LED 13a of the notification device 13 of the main body unit 2.

[Third Terminal Group]

The third terminal group TG3 includes a ground terminal 71A, first to fourth transmission terminals 81A to 84A, and first to fourth reception terminals 85A to 88A. The term "ground terminal 71A" is another example of the "first terminal". Each of the first to fourth transmission terminals 81A to 84A and the first to fourth reception terminals 85A to 88A is an example of a "third terminal".

The ground terminal 71A is a terminal connected to the ground of the first substrate 31A of the first SSD module 30A. A plurality of the ground terminals 71A are provided at a first end portion E1 and a second end portion E2 of the third terminal group TG3. In the present embodiment, two terminals 53 from an end of the first end portion E1 of the third terminal group TG3 are ground terminals 71A. Further, three terminals 53 from an end of the second end portion E2 of the third terminal group TG3 are ground terminals 71A.

The first to fourth transmission terminals 81A to 84A and the first to fourth reception terminals 85A to 88A are terminals used for transmission and reception of data between the host device 10 and the first SSD module 30A. For example, the first to fourth transmission terminals 81A to 84A are terminals configured to allow write data to be written into the first SSD module 30A to flow from the host device 10 to the first SSD module 30A. On the other hand, the first to fourth reception terminals 85A to 88A are terminals configured to allow read data read from the first SSD module 30A to flow from the first SSD module 30A to the host device 10. The first to fourth transmission terminals 81A to 84A and the first to fourth reception terminals 85A to 88A are terminals corresponding to lanes of a PCIe standard, for example.

[Fourth Terminal Group]

The fourth terminal group TG4 includes a ground terminal 71B, first to fourth transmission terminals 81B to 84B, and first to fourth reception terminals 85B to 88B, similarly to the third terminal group TG3. The term "ground terminal 71B" is another example of the "second terminal". Each of the first to fourth transmission terminals 81B to 84B and the first to fourth reception terminals 85B to 88B is an example of a "fourth terminal".

The ground terminal 71B is a terminal connected to the ground of the second substrate 31B of the second SSD module 30B. A plurality of the ground terminals 71B are provided at a first end portion E1 and a second end portion E2 of the fourth terminal group TG4. In the present embodiment, three terminals 54 from an end of the first end portion E1 of the fourth terminal group TG4 are ground terminals 71B. Further, two terminals 54 from an end of the second end portion E2 of the fourth terminal group TG4 are ground terminals 71B.

The first to fourth transmission terminals 81B to 84B and the first to fourth reception terminals 85B to 88B are terminals used for transmission and reception of data between the host device 10 and the second SSD module 30B. For example, the first to fourth transmission terminals 81B to 84B are terminals configured to allow write data to be written into the second SSD module 30B to flow from the host device 10 to the second SSD module 30B. On the other hand, the first to fourth reception terminals 85B to 88B are terminals configured to allow read data read from the second SSD module 30B to flow from the second SSD module 30B to the host device 10. The first to fourth transmission terminals 81B to 84B and the first to fourth reception terminals 85B to 88B are terminals corresponding to lanes of a PCIe standard, for example.

Figure 7:
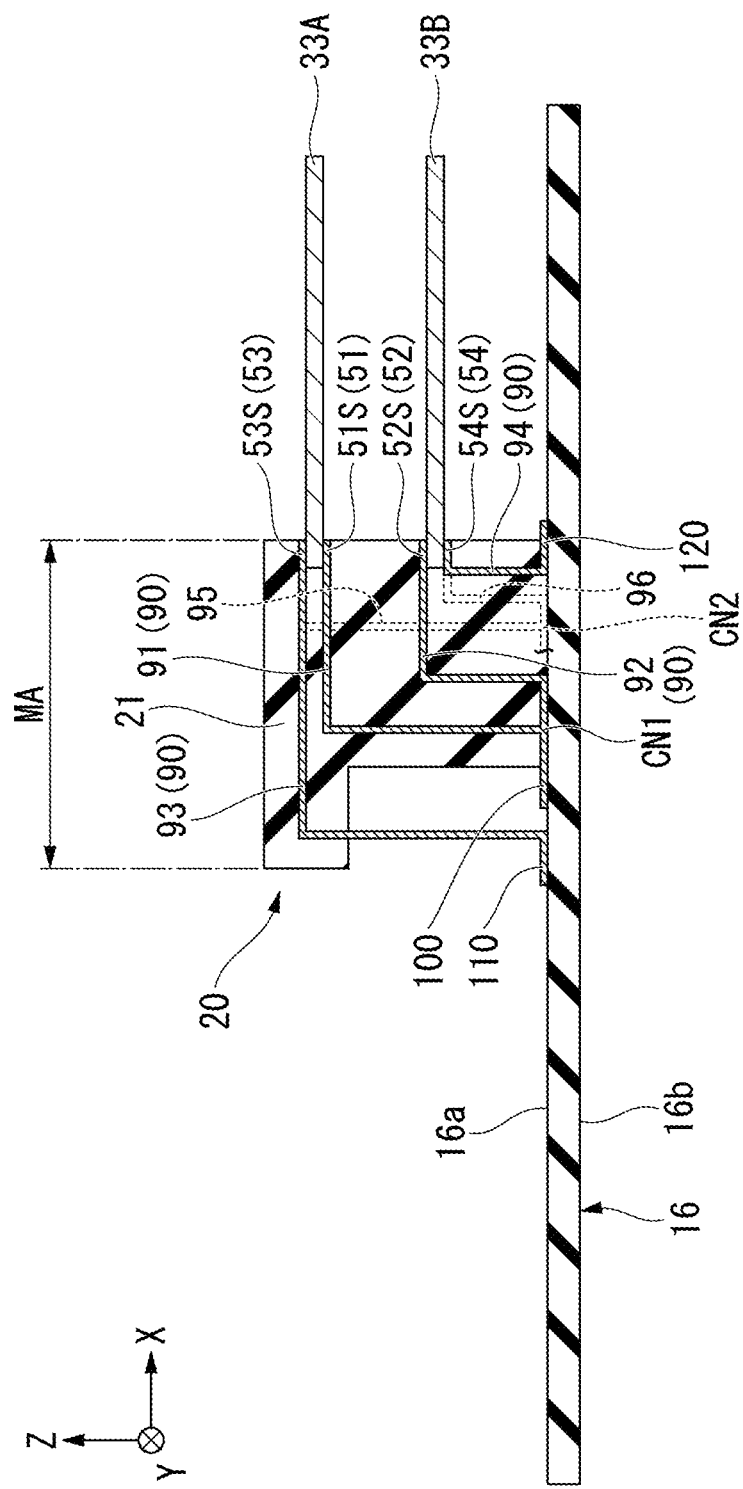
FIG. 7 is a cross-sectional view showing a connector and a circuit board according to the embodiment.

FIG. 7 is a cross-sectional view showing the circuit board 16 and the connector 20. The connector 20 has a plurality of conductive portions 90 for connecting the plurality of terminals 51, 52, 53, and 54 included in the first to fourth terminal groups TG1, TG2, TG3, and TG4 to the circuit board 16, respectively. The conductive portion 90 is formed integrally with the corresponding terminals 51, 52, 53, and 54, for example. The conductive portion 90 extends from the terminals 51, 52, 53, and 54 toward the circuit board 16 inside the connector case 21.

In the present embodiment, the plurality of conductive portions 90 includes a first conductive portion 91 connected to a first specific terminal 51S included in the first terminal group TG1 and a second conductive portion 92 connected to a second specific terminal 52S included in the second terminal group TG2. The first conductive portion 91 and the second conductive portion 92 are electrically connected to each other in an installation region MA of the connector 20 when viewed in the Z direction. The installation region MA means a region overlapping the connector 20 when viewed in the Z direction. The phrase "electrically connected to each other in an installation region MA of the connector 20 when viewed in the Z direction" is not limited to a case where the first conductive portion 91 and the second conductive portion 92 are connected to each other inside the connector case 21, but may also include a case where the first conductive portion 91 and the second conductive portion 92 are connected to each other through a surface layer or an inner layer of the circuit board 16 included in the installation region MA (see a first modification example to be described below).

In the present embodiment, the first conductive portion 91 and the second conductive portion 92 are coupled to each other by a coupling portion CN1 provided inside the connector case 21 and connected to the circuit board 16. Then, the first conductive portion 91 and the second conductive portion 92 are connected to the host bridge 14 or the power supply circuit 15 via a common wire 100 for the first specific terminal 51S and the second specific terminal 52S. The common wire 100 is provided on the circuit board 16.

In the present embodiment, as an example of the set including the first specific terminal 51S and the second specific terminal 52S having the above connection relationship, there is a set including the power supply terminal 61A of the first terminal group TG1 and the power supply terminal 61B of the second terminal group TG2. In this case, the first conductive portion 91 connected to the power supply terminal 61A of the first terminal group TG1 and the second conductive portion 92 connected to the power supply terminal 61B of the second terminal group TG2 are coupled to each other inside the connector case 21 and connected to the circuit board 16 and are connected to the power supply circuit 15 via a common wire 101 (see FIG. 8).

Further, in the present embodiment, as another example of the set including the first specific terminal 51S and the second specific terminal 52S, there is a set including the reset signal terminal 62A of the first terminal group TG1 and the reset signal terminal 62B of the second terminal group TG2. In this case, the first conductive portion 91 connected to the reset signal terminal 62A of the first terminal group TG1 and the second conductive portion 92 connected to the reset signal terminal 62B of the second terminal group TG2 are coupled to each other inside the connector case 21 and connected to the circuit board 16 and are connected to the host bridge 14 via a common wire 102 (see FIG. 8).

Further, as still another example of the set including the first specific terminal 51S and the second specific terminal 52S, there are a set including the bus data terminal 63A of the first terminal group TG1 and the bus data terminal 63B of the second terminal group TG2, a set including the bus clock terminal 64A of the first terminal group TG1 and the bus clock terminal 64B of the second terminal group TG2, a set including the first PLP signal terminal 65A of the first terminal group TG1 and the first PLP signal terminal 65B of the second terminal group TG2, a set including the second PLP signal terminal 66A of the first terminal group TG1 and the second PLP signal terminal 66B of the second terminal group TG2, and a set including the state signal terminal 67A of the first terminal group TG1 and the state signal terminal 67B of the second terminal group TG2.

In the present embodiment, the plurality of conductive portions 90 provided inside the connector 20 includes a third conductive portion 93 connected to a third specific terminal 53S included in the third terminal group TG3 and a fourth conductive portion 94 connected to a fourth specific terminal 54S included in the fourth terminal group TG4. In the present embodiment, the third conductive portion 93 and the fourth conductive portion 94 are insulated from each other and are separately connected to the circuit board 16. Then, the third conductive portion 93 and the fourth conductive portion 94 are connected to the host bridge 14 independently of each other via individual wires 110 and 120 for the third specific terminal 53S and the fourth specific terminal 54S, which are provided on the circuit board 16.

In the present embodiment, as an example of the set including the third specific terminal 53S and the fourth specific terminal 54S having the above connection relationship, there is a set including the first transmission terminal 81A of the third terminal group TG3 and the first transmission terminal 81B of the second terminal group TG2. In this case, in the present embodiment, the third conductive portion 93 connected to the first transmission terminal 81A of the third terminal group TG3 and the fourth conductive portion 94 connected to the first transmission terminal 81B of the fourth terminal group TG4 are separately connected to the circuit board 16. The third conductive portion 93 and the fourth conductive portion 94 are connected to the host bridge 14 independently of each other via individual wires 111 and 121 (see FIG. 8). The same applies to the second to fourth transmission terminals 82A to 84A and the first to fourth reception terminals 85A to 88A of the third terminal group TG3, and to the second to fourth transmission terminals 82B to 84B and the first to fourth reception terminals 85B to 88B of the fourth terminal group TG4.

In the present embodiment, the plurality of conductive portions 90 provided inside the connector 20 includes a fifth conductive portion 95 connected to a fifth specific terminal (for example, the ground terminal 71A) included in the third terminal group TG3 and a sixth conductive portion 96 connected to a sixth specific terminal (for example, the ground terminal 71B) included in the fourth terminal group TG4. The fifth conductive portion 95 and the sixth conductive portion 96 are electrically connected to each other in the installation region MA of the connector 20 when viewed in the Z direction. In the present embodiment, the fifth conductive portion 95 and the sixth conductive portion 96 are coupled to each other by a coupling portion CN2 provided inside the connector case 21 and are connected to the ground of the circuit board 16 via a common wire 108 (see FIG. 8) provided on the circuit board 16.

Figure 8:
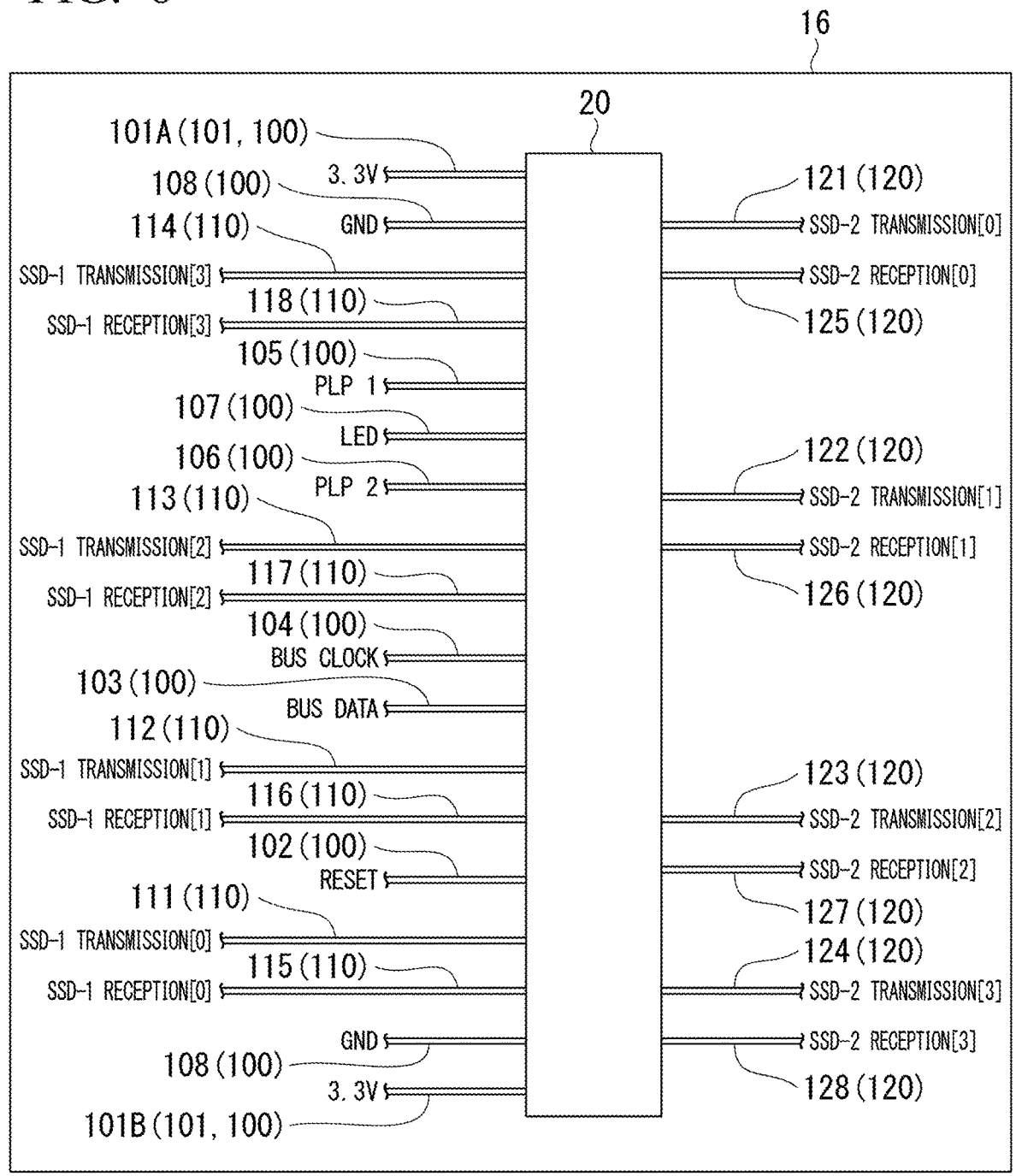
FIG. 8 is a plan view showing the connector and the circuit board according to the embodiment.

FIG. 8 is a plan view showing the circuit board 16 and the connector 20. In the present embodiment, the power supply terminal 61A of the first end portion E1 of the first terminal group TG1 and the power supply terminal 61B of the second end portion E2 of the second terminal group TG2 are connected to each other inside the connector case 21 and connected to a common wire 101A provided on the circuit board 16. Further, the power supply terminal 61A of the second end portion E2 of the first terminal group TG1 and the power supply terminal 61B of the first end portion E1 of the second terminal group TG2 are connected to each other inside the connector case 21 and connected to a common wire 101B provided on the circuit board 16. The wires 101A and 101B are connected to the power supply circuit 15.

The power supply terminal 61A of the first end portion E1 of the first terminal group TG1 and the power supply terminal 61B of the first end portion E1 of the second terminal group TG2 may be connected to each other inside the connector case 21 and connected to the common wire 101A provided on the circuit board 16. Further, the power supply terminal 61A of the second end portion E2 of the first terminal group TG1 and the power supply terminal 61B of the second end portion E2 of the second terminal group TG2 may be connected to each other inside the connector case 21 and connected to the common wire 101B provided on the circuit board 16. The wires 101A and 101B are connected to the power supply circuit 15. In this case, since the terminals located physically close to each other are connected to each other, a wiring layout in the connector case 21 can be simplified.

Similarly, the reset signal terminal 62A of the first terminal group TG1 and the reset signal terminal 62B of the second terminal group TG2 are connected to each other inside the connector case 21 and connected to the common wire 102 provided on the circuit board 16. The bus data terminal 63A of the first terminal group TG1 and the bus data terminal 63B of the second terminal group TG2 are connected to each other inside the connector case 21 and connected to a common wire 103 provided on the circuit board 16. The bus clock terminal 64A of the first terminal group TG1 and the bus clock terminal 64B of the second terminal group TG2 are connected to each other inside the connector case 21 and connected to a common wire 104 provided on the circuit board 16. The first PLP signal terminal 65A of the first terminal group TG1 and the first PLP signal terminal 65B of the second terminal group TG2 are connected to each other inside the connector case 21 and connected to a common wire 105 provided on the circuit board 16. The second PLP signal terminal 66A of the first terminal group TG1 and the second PLP signal terminal 66B of the second terminal group TG2 are connected to each other inside the connector case 21 and connected to a common wire 106 provided on the circuit board 16. The state signal terminal 67A of the first terminal group TG1 and the state signal terminal 67B of the second terminal group TG2 are connected to each other inside the connector case 21 and connected to a common wire 107 provided on the circuit board 16. The wires 102 to 107 are connected to the host bridge 14.

On the other hand, the transmission terminals 81A to 84A of the third terminal group TG3, the reception terminals 85A to 88A of the third terminal group TG3, the transmission terminals 81B to 84B of the fourth terminal group TG4, and the reception terminals 85B to 88B of the fourth terminal group TG4 are led out to the circuit board 16 in a state of being insulated from each other inside the connector 20 and are connected to the wires (lanes) 111 to 114, 115 to 118, 121 to 124, and 125 to 128 provided on the circuit board 16 in a one-to-one manner, respectively. The wires 111 to 118 and 121 to 128 are connected to the host bridge 14.

Figure 9:
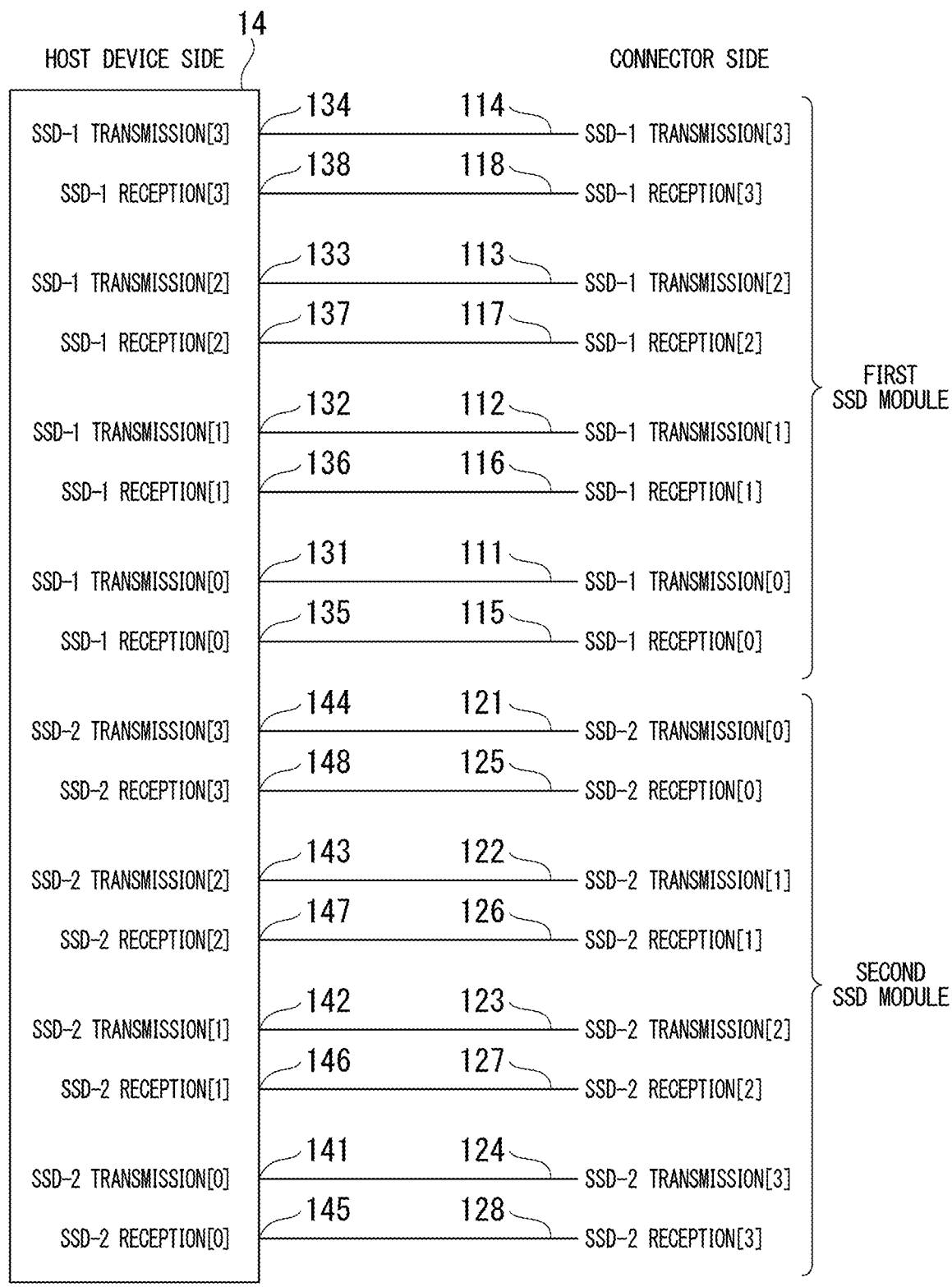
FIG. 9 is a diagram showing a lane reverse function according to the embodiment.

FIG. 9 is a diagram showing a lane reverse function of the host device 10. The lane reverse function to be described below is realized, for example, by the host bridge 14, or by cooperation between the host bridge 14 and the host controller 11.

The host bridge 14 has terminals 131 to 138 and 141 to 148 respectively corresponding to the wires (lanes) 111 to 118 and 121 to 128. The terminals 131 to 134 for the first SSD module 30A are arranged in an order of a first transmission terminal 131, a second transmission terminal 132, a third transmission terminal 133, and a fourth transmission terminal 134 as physical positions in the host bridge 14. Similarly, the terminals 135 to 138 for the first SSD module 30A are arranged in an order of a first reception terminal 135, a second reception terminal 136, a third reception terminal 137, and a fourth reception terminal 138 as physical positions in the host bridge 14. Here, the wires (lanes) 111 to 118 of the circuit board 16 for the first SSD module 30A are arranged in the same order as the terminals 131 to 138 of the host bridge 14 as physical positions on the circuit board 16. Therefore, the terminals 131 to 138 of the host bridge 14 can be directly connected to the wires 111 to 118 of the circuit board 16 in a one-to-one manner.

On the other hand, the terminals 141 to 144 for the second SSD module 30B of the host bridge 14 are arranged in the same direction as the terminals 131 to 134 for the first SSD module 30A in the order of a first transmission terminal 141, a second transmission terminal 142, a third transmission terminal 143, and a fourth transmission terminal 144 as physical positions in the host bridge 14. Similarly, the terminals 145 to 148 for the second SSD module 30B are arranged in the order of a first reception terminal 145, a second reception terminal 146, a third reception terminal 147, and a fourth reception terminal 148 as physical positions in the host bridge 14. However, in the present embodiment, the second SSD module 30B is attached to the connector 20 by being inverted upside down as described below. Therefore, the wires (lanes) 121 to 128 of the circuit board 16 for the second SSD module 30B are arranged in the reverse order of the terminals 141 to 148 of the host bridge 14. Therefore, the terminals 141 to 148 of the host bridge 14 cannot be directly connected to the wires 121 to 128 of the circuit board 16 in a one-to-one manner. In order to physically align the terminals 141 to 148 of the host bridge 14 with the wires 121 to 128 of the circuit board 16, it is necessary to change the order of the wires 121 to 128 by making the wires cross each other in the circuit board 16.

In the present embodiment, the host device 10 reversely rearranges the terminal arrangement of the terminals 141 to 148 of the host bridge 14 on the software by the lane reverse function. As a result, the host device 10 causes the fourth transmission terminal 144, the third transmission terminal 143, the second transmission terminal 142, and the first transmission terminal 141 to transmit signals originally transmitted from the first transmission terminal 141, the second transmission terminal 142, the third transmission terminal 143, and the fourth transmission terminal 144, respectively. Further, the host device 10 treats signals received by the fourth reception terminal 148, the third reception terminal 147, the second reception terminal 146, and the first reception terminal 145 as signals originally received by the first reception terminal 145, the second reception terminal 146, the third reception terminal 147, and the fourth reception terminal 148, respectively. Therefore, in the present embodiment, it is not necessary to change the order of the wires 121 to 128 by making the wires cross each other in the circuit board 16, and the wires 121 to 128 are provided by a relatively simple wiring layout.

Here, returning to FIG. 4, the remaining configurations will be described.

In the present embodiment, the first SSD module 30A and the second SSD module 30B are disposed in parallel with the first surface 16a of the circuit board 16 in a state of being attached to the connector 20. The first SSD module 30A is inserted into the first slot 22A in a posture in which the first surface S1 of the first substrate 31A is directed upward and the second surface S2 is directed downward. Then, the plurality of terminals 35b on the second surface S2 of the first substrate 31A are connected to the first terminal group TG1 of the first slot 22A, and the plurality of terminals 35a on the first surface S1 of the first substrate 31A are connected to the third terminal group TG3. On the other hand, the second SSD module 30B is attached to the connector 20 in a posture inverted with respect to the first SSD module 30A (posture rotated upside down). More specifically, while the first SSD module 30A and the second SSD module 30B (namely, the first memory system and the second memory system) are attached to the connector 20, the first SSD module 30A and the second SSD module 30B are rotationally symmetrical to each other with respect to an axis O relating to the connector. The axis O is in parallel to an insertion direction in which the first SSD module 30A and the second SSD module 30B are insertable into the first slot 22A and the second slot 22B, respectively. That is, the second SSD module 30B is inserted into the second slot 22B in a posture in which the third surface S3 of the second substrate 31B is directed downward and the fourth surface S4 is directed upward. Then, the plurality of terminals 35b on the fourth surface S4 of the second substrate 31B are connected to the second terminal group TG2 of the second slot 22B, and the plurality of terminals 35a on the third surface S3 of the second substrate 31B are connected to the fourth terminal group TG4. In other words, the first SSD module 30A and the second SSD module 30B are attached to the connector 20 such that the second surface S2 and the fourth surface S4, on which the memory controller 32 and the semiconductor memory device 33 are not mounted, face each other.

Next, the fixed structure of the two SSD modules 30 will be described.

As shown in FIG. 4, a fixing boss 151 is provided on the first surface 16a of the circuit board 16. The boss 151 is provided at a position corresponding to the second end portion 30e2 of the SSD module 30. The boss 151 is provided with an engaging hole 151h with which the fixing member 153 to be described below is to be engaged. The second SSD module 30B is placed on the boss 151. The boss 151 is made of metal, for example.

A spacer 152 is provided between the first SSD module 30A and the second SSD module 30B. The spacer 152 is interposed between the first SSD module 30A and the second SSD module 30B to maintain a distance between the first SSD module 30A and the second SSD module 30B. The spacer 152 has a through-hole 152h through which the fixing member 153 is inserted. The spacer 152 is made of metal, for example.

The fixing member 153 has a head portion 153a and a shaft portion 153b. The head portion 153a faces the first SSD module 30A from a side opposite to the spacer 152. The shaft portion 153b is passed through the recess portion 36 of the second end portion 30e2 of the first SSD module 30A, the through-hole 152h of the spacer 152, and the recess portion 36 of the second end portion 30e2 of the second SSD module 30B and is engaged with the engaging hole 151h of the boss 151. As a result, the positions of the two SSD modules 30 are fixed. The fixing member 153 is made of metal, for example.

Next, a heat radiation mechanism of the two SSD modules 30 will be described.

The heat radiation member 40 is located between the first SSD module 30A and the second SSD module 30B in the Z direction. The heat radiation member 40 extends, for example, in the X direction in a gap between the first SSD module 30A and the second SSD module 30B. The heat radiation member 40 may be a heat sink having a plurality of fins, a heat pipe connected to the heat sink, or a water-cooled heat radiation device to which cooling water is supplied from a cooling water supply device.

The first heat conduction member 41A is provided between the first substrate 31A of the first SSD module 30A and the heat radiation member 40 and is in contact with the first substrate 31A of the first SSD module 30A and the heat radiation member 40. The first heat conduction member 41A is made of, for example, a heat radiation material (thermal interface material: TIM). The TIM is, for example, grease or an elastomer sheet.

Similarly, the second heat conduction member 41B is provided between the second substrate 31B of the second SSD module 30B and the heat radiation member 40 and is in contact with the second substrate 31B of the second SSD module 30B and the heat radiation member 40. The second heat conduction member 41B is made of, for example, a heat radiation material (TIM).

<2. Action>

In the present embodiment, as shown in FIG. 8, power is supplied to a plurality of the power supply terminals 61A and 61B of the connector 20 via the common wire 101 provided on the circuit board 16. In addition, a plurality of the ground terminals 71A and 71B of the connector 20 are connected to the ground of the circuit board 16 via the common wire 108 provided on the circuit board 16.

A common reset signal is transmitted to the two SSD modules 30 via the common wire 102 provided on the circuit board 16. In addition, a communication bus for the two SSD modules 30 is formed via the common wires 103 and 104 provided on the circuit board 16. Transmission and reception of a signal for instructing the start of the data saving processing of the two SSD modules 30 or recognizing the completion thereof are performed via the common wires 105 and 106 provided on the circuit board 16. Reception of a signal for recognizing whether or not the two SSD modules 30 are in operation is performed via the common wire 107 provided on the circuit board 16.

Part of the heat generated by the two SSD modules 30 propagates to the second end portion 30e2 of the first substrate 31A or the second end portion 30e2 of the second substrate 31B through the wiring pattern included in the first substrate 31A or the second substrate 31B and propagates to the circuit board 16 via the fixing member 153. Further, another part of the heat generated by the two SSD modules 30 propagates to the outside of the two SSD modules 30 by the heat radiation member 40. As a result, the heat radiation of the two SSD modules 30 is promoted.

4. Advantages

Here, a case where a plurality of SSD modules are placed flat (when the SSD modules are attached to different connectors one by one) will be considered. In this case, an installation area is required for the plurality of SSD modules. In addition, when a heat radiation mechanism is provided for each of the plurality of SSD modules, the installation area increases by the amount of a plurality of the heat radiation mechanisms.

Therefore, it is conceivable to use a multi-stage connector having a plurality of slots to dispose the plurality of SSD modules 30 in an overlapping manner. However, in a case where terminal arrangement of the plurality of slots is the same, device arrangement in the plurality of SSD modules 30 may be unbalanced, and the performance may be deteriorated in terms of heat radiation or another aspect. For example, when the plurality of SSD modules are disposed in an overlapping manner in the same vertical direction, a first memory controller (high heat generation device) mounted on a first SSD module faces a side opposite to a second SSD module. However, since a second memory controller (high heat generation device) mounted on the second SSD module is located in a space between a substrate of the first SSD module and a substrate of the second SSD module, the size of the heat radiation mechanism may be increased, or the heat radiation performance may be deteriorated.

On the other hand, in the present embodiment, the storage system 1 includes the circuit board 16, the connector 20, the first SSD module 30A, and the second SSD module 30B. The connector 20 has the first slot 22A and the second slot 22B that are separated from each other in the Z direction. According to such a configuration, since the plurality of SSD modules 30 are disposed in an overlapping manner, the installation area can be reduced. As a result, the storage system 1 can be made small in size.

In the present embodiment, the terminal arrangement of the first terminal group TG1 of the first slot 22A is reverse to the terminal arrangement of the second terminal group TG2 of the second slot 22B in the Y direction. According to such a configuration, the devices mounted on the first SSD module 30A and the second SSD module 30B are easily disposed symmetrically in vertical and/or horizontal directions. As a result, for example, the temperature balance in the plurality of SSD modules 30 is improved. As a result, the heat radiation mechanism for the plurality of SSD modules 30 can be made small in size. As a result, the storage system 1 can be further made small in size.

In the present embodiment, the connector 20 has the connector case 21, the first conductive portion 91 connected to the first specific terminal 51S included in the plurality of terminals 51 of the first terminal group TG1, and the second conductive portion 92 connected to the second specific terminal 52S included in the plurality of terminals 52 of the second terminal group TG2. The first conductive portion 91 and the second conductive portion 92 are connected to each other in the installation region MA of the connector 20 when viewed in the thickness direction of the circuit board 16. According to such a configuration, it is possible to simplify the connection structure between the connector 20 and the circuit board 16 and to use part of the wires provided on the circuit board 16 in common. As a result, the storage system 1 can be further made small in size.

In the present embodiment, the first slot 22A has the first terminal group TG1 and the third terminal group TG3. The first terminal group TG1 is located between the third terminal group TG3 and the second slot 22B. The second slot 22B has the second terminal group TG2 and the fourth terminal group TG4. The second terminal group TG2 is located between the fourth terminal group TG4 and the first slot 22A. Then, the conductive portions 91 and 92 of the two specific terminals 51S and 52S included in the two adjacent terminal groups TG1 and TG2 among the four terminal groups TG1, TG2, TG3, and TG4 are connected to each other in the installation region MA of the connector 20. According to such a configuration, it is possible to simplify the connection structure between the connector 20 and the circuit board 16 and to use part of the wires provided on the circuit board 16 in common with a relatively simple configuration. As a result, the storage system 1 can be further made small in size.

5. Modification Example

Next, some modification examples will be described. In each modification example, the configurations other than the following description are the same as those in the above-described embodiment.

5.1 First Modification Example

Figure 10:
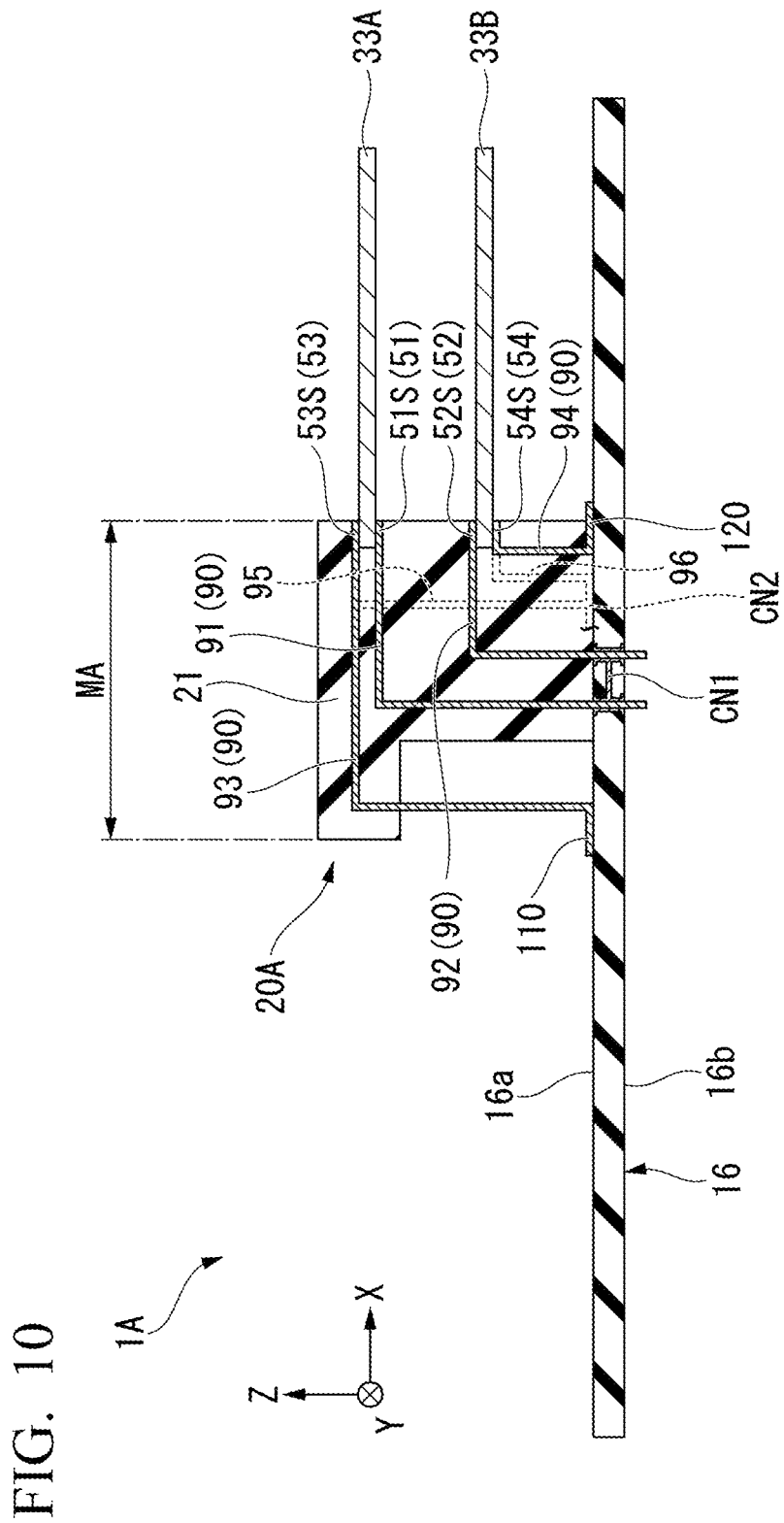
FIG. 10 is a cross-sectional view showing a connector and a circuit board of a first modification example of the embodiment.

FIG. 10 is a cross-sectional view showing a connector 20A and the circuit board 16 of a storage system 1A of a first modification example. In the first modification example, the plurality of conductive portions 90 includes the first conductive portion 91 connected to a first specific terminal 51S included in the first terminal group TG1 and the second conductive portion 92 connected to a second specific terminal 52S included in the second terminal group TG2. The first conductive portion 91 and the second conductive portion 92 are coupled to each other by the coupling portion CN1 provided on the surface layer or the inner layer of the circuit board 16 in the installation region MA of the connector case 21 viewed in the thickness direction of the circuit board 16 and are connected to the common wire 100. Even with such a configuration, the storage system 1 can be made small in size as in the above-described embodiment. The coupling portion CN2 for coupling the fifth conductive portion 95 and the sixth conductive portion 96 to each other may also be provided on the surface layer or the inner layer of the circuit board 16 in the same manner as the coupling portion CN1.

5.2 Second Modification Example

Figure 11:
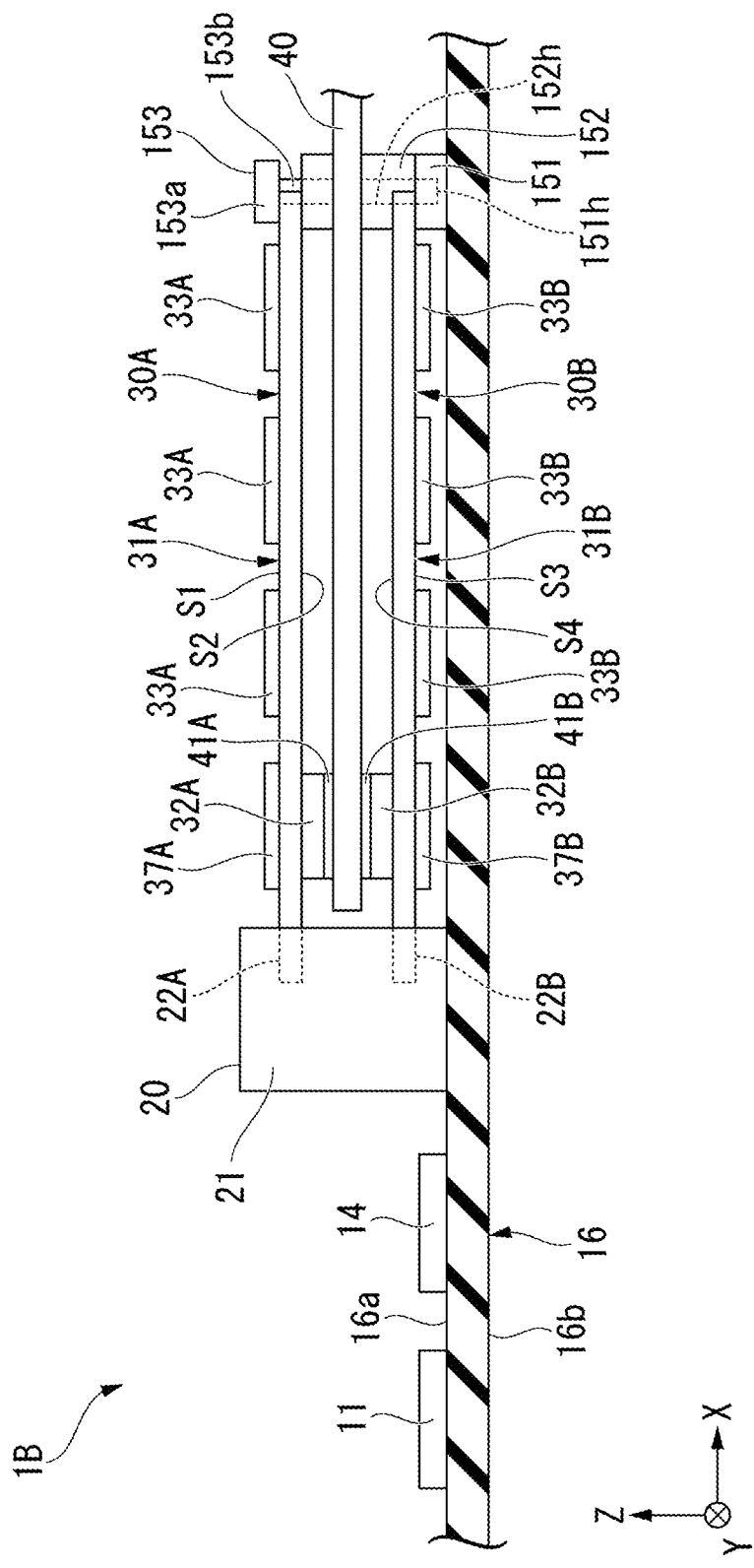
FIG. 11 is a cross-sectional view showing a storage system of a second modification example of the embodiment.

FIG. 11 is a cross-sectional view showing a storage system 1B of a second modification example. In the second modification example, the first memory controller 32A is mounted on the second surface S2 of the first substrate 31A of the first SSD module 30A. The volatile memory 37A and the plurality of first semiconductor memory devices 33A are mounted on the first surface S1 of the first substrate 31A.

On the other hand, the second memory controller 32B is mounted on the fourth surface S4 of the second substrate 31B of the second SSD module 30B. The volatile memory 37B and the plurality of second semiconductor memory devices 33B are mounted on the third surface S3 of the second substrate 31B.

The first SSD module 30A and the second SSD module 30B are attached to the connector 20 such that the second surface S2 and the fourth surface S4 face each other. The heat radiation member 40 is connected to the first memory controller 32A via the first heat conduction member 41A. Further, the heat radiation member 40 is connected to the second memory controller 32B via the second heat conduction member 41B.

Even with such a configuration, the storage system 1 can be made small in size as in the above-described embodiment.

Although the embodiment and the modification examples have been described above, the embodiment and the modification examples are not limited to the above-described examples. The embodiment and the modification examples may be realized in combination with each other. For example, the first slot 22A and the second slot 22B of the connector 20 may be open long in the Z direction (thickness direction of the circuit board 16). In this case, the first SSD module 30A and the second SSD module 30B are attached to the connector 20 in a posture perpendicular to the circuit board 16. In addition, the first slot 22A and the second slot 22B of the connector 20 may be open in the Z direction.

According to at least one embodiment described above, the storage system includes the circuit board, the connector, the first memory module, and the second memory module. The connector has the first slot and the second slot. The terminal arrangement of the first terminal group of the first slot is reverse to the terminal arrangement of the second terminal group of the second slot. According to such a configuration, the storage system can be made small in size.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A storage system comprising:
   a circuit board;
   a connector on the circuit board, the connector including
      a first slot and a second slot, the first slot having a first terminal group of first terminals aligned in a first direction, the second slot being separated from the first slot in a second direction not parallel with the first direction, and the second slot having a second terminal group of second terminals aligned in the first direction, the first terminal group being reverse to the second terminal group in terminal arrangement order in the first direction;

a first memory system that is connectable to the first terminal group, while the first memory system is inserted into the first slot, the first memory system comprising a first substrate and a first semiconductor memory device on the first substrate; and a second memory system that is connectable to the second terminal group, while the second memory system is inserted into the second slot, the second memory system comprising a second substrate and a second semiconductor memory device on the second substrate.

2. The storage system according to claim 1,
wherein the first substrate has first and second surfaces facing opposite to each other,
wherein the first memory system further comprises a first memory controller configured to control the first semiconductor memory device, the first memory controller being on the first surface,
wherein the second substrate has third and fourth surfaces facing opposite to each other,
wherein the second memory system further comprises a second memory controller configured to control the second semiconductor memory device, the second memory controller being on the third surface, and
wherein the first memory system and the second memory system are attachable to the connector with the second surface and the fourth surface facing each other.

3. The storage system according to claim 1,
wherein the first substrate has first and second surfaces facing opposite to each other,
wherein the first memory system further comprises a first memory controller configured to control the first semiconductor memory device, the first semiconductor memory device being on the second surface,
wherein the second substrate has third and fourth surfaces facing opposite to each other, wherein the second memory system further comprises a second memory controller configured to control the second semiconductor memory device, the second semiconductor memory device being on the fourth surface, and
wherein the first memory system and the second memory system are attachable to the connector with the second surface and the fourth surface facing each other.

4. The storage system according to claim 1,
wherein, while the first memory system and the second memory system are attached to the connector, the first memory system and the second memory system are rotationally symmetrical to each other with respect to an axis relating to the connector, the axis being in parallel to an insertion direction in which the first memory system and the second memory system are insertable into the first and second slots, respectively.

5. The storage system according to claim 1,
wherein the connector has a connector case, a first conductive portion connected to a first one terminal of the first terminals of the first terminal group, and a second conductive portion connected to a second one terminal of the second terminals of the second terminal group, and
the first conductive portion and the second conductive portion are connected to each other in an installation region of the connector when viewed in a thickness direction of the circuit board.

6. The storage system according to claim 5,
wherein the first conductive portion and the second conductive portion are connected to each other inside the connector case.

7. The storage system according to claim 5,
wherein the first conductive portion and the second conductive portion are connected to each other via a surface layer of the circuit board in the installation region of the connector when viewed in the thickness direction of the circuit board.

8. The storage system according to claim 5,
wherein the first conductive portion and the second conductive portion are connected to each other via an inner layer of the circuit board in the installation region of the connector when viewed in the thickness direction of the circuit board.

9. The storage system according to claim 5, further comprising:
a bridge circuit on the circuit board,
wherein the first conductive portion and the second conductive portion are connected to the bridge circuit via a common wire of the circuit board.

10. The storage system according to claim 5, further comprising:
a power supply circuit on the circuit board,
wherein the first conductive portion and the second conductive portion are connected to the power supply circuit via a common wire of the circuit board.

11. The storage system according to claim 5,
wherein the first one terminal is a first power supply terminal through which power is supplied to the first memory system and
the second one terminal is a second power supply terminal through which power is supplied to the second memory system.

12. The storage system according to claim 5,
wherein the first one terminal is a first ground terminal connected to the first memory system and
the second one terminal is a second ground terminal connected to the second memory system.

13. The storage system according to claim 5,
wherein the first one terminal is configured to receive a signal indicating a completion without failure of a first writing operation of the first memory system, and
the second one terminal is configured to receive a signal indicating a completion without failure of a writing operation of the second memory system.

14. The storage system according to claim 5,
wherein the first one terminal and the second one terminal are configured to allow a reset signal to be output for resetting the first memory system and the second memory system.

15. The storage system according to claim 5,
wherein the first one terminal and the second one terminal are configured to allow a signal including address information to pass through, the address information specifying one of the first memory system and the second memory system.

16. The storage system according to claim 1,
wherein the first slot has a third terminal group of third terminals aligned in the first direction, the third terminal group facing the first memory system from a side opposite to the first terminal group, the first terminal group is located between the third terminal group and the second slot in the second direction, the second slot has a fourth terminal group of fourth terminals aligned in the first direction, the fourth terminal group facing the second memory system from a side opposite to the second terminal group, the second terminal group is located between the fourth terminal group and the first slot in the second direction, and the connector has a connector case, a first conductive portion connected to a first one terminal of the first terminals of the first terminal group, and a second conductive portion connected to a second one terminal of the second terminals of the second terminal group, wherein the first conductive portion and the second conductive portion are connected to each other in an installation region of the connector when viewed in a thickness direction of the circuit board.

17. The storage system according to claim 16, further comprising:

a bridge circuit on the circuit board, wherein the connector further has a third conductive portion connected to a third one terminal of the third terminals of the third terminal group, and a fourth conductive portion connected to a fourth one terminal of the fourth terminals of the fourth terminal group, wherein the third conductive portion and the fourth conductive portion are independently connected to the bridge circuit, and the first conductive portion and the second conductive portion are connected to the bridge circuit via a common wire of the circuit board.

18. The storage system according to claim 1, wherein the circuit board has a mounting surface, the connector being on the mounting surface, and the first memory system and the second memory system are disposed in parallel with the mounting surface of the circuit board.

19. The storage system according to claim 1, further comprising:

a heat radiation member disposed between the first memory system and the second memory system and connectable to the first memory system and the second memory system.

20. A storage system comprising:

a circuit board;

a connector on the circuit board, the connector including a first slot and a second slot, the first slot having a first terminal group of first terminals aligned in a first direction, the second slot being separated from the first slot in a second direction not parallel with the first direction, and the second slot having a second terminal group of second terminals aligned in the first direction, the first terminal group being reverse to the second terminal group in terminal arrangement order in the first direction; and a memory system that is connectable to the first terminal group, while the memory system is inserted into the first slot, the memory system comprising a substrate and a semiconductor memory device on the substrate.

* * * * *